(12) United States Patent
Saruta et al.

(10) Patent No.: US 11,520,062 B2
(45) Date of Patent: Dec. 6, 2022

(54) RADIATION IMAGING PANEL, RADIATION IMAGING APPARATUS, RADIATION IMAGING SYSTEM, AND SCINTILLATOR PLATE

(71) Applicant: CANON KABUSHIKI KAISHA, Tokyo (JP)

(72) Inventors: Shoshiro Saruta, Tokyo (JP); Kazumi Nagano, Tokyo (JP); Keiichi Nomura, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/366,272

(22) Filed: Jul. 2, 2021

(65) Prior Publication Data
US 2022/0018975 A1 Jan. 20, 2022

(30) Foreign Application Priority Data
Jul. 14, 2020 (JP) .............................. JP2020-120869

(51) Int. Cl.
*H01L 27/146* (2006.01)
*G01T 1/20* (2006.01)
(Continued)

(52) U.S. Cl.
CPC .......... *G01T 1/20188* (2020.05); *G01T 1/164* (2013.01); *G01T 1/2002* (2013.01);
(Continued)

(58) Field of Classification Search
CPC ....... G01T 1/003; G01T 1/164; G01T 1/2002; G01T 1/20185; G01T 1/20188;
(Continued)

(56) References Cited

U.S. PATENT DOCUMENTS 7,256,404 B2    8/2007    Inoue et al.
7,514,686 B2    4/2009    Ogawa et al.
(Continued)

FOREIGN PATENT DOCUMENTS

JP    2006-052980 A    2/2006
JP    2011-033562 A    2/2011
(Continued)

OTHER PUBLICATIONS

Saruta et al., U.S. Appl. No. 17/379,228, filed Jul. 19, 2021.
(Continued)

*Primary Examiner* — Mark R Gaworecki
(74) *Attorney, Agent, or Firm* — Venable LLP

(57) ABSTRACT

A radiation imaging panel is provided. The panel comprises a substrate on which a plurality of pixels each including a photoelectric conversion element are arranged, a scintillator arranged over the substrate, and a protective layer arranged so as to cover the scintillator. The scintillator includes a plurality of columnar crystals containing an alkali metal halide. The protective layer includes a resin layer containing a resin to which particles of a metal oxide are added. A thickness of the resin layer from an apex of each of the plurality of columnar crystals to an upper surface of the resin layer is not less than 10 μm and less than 30 μm, and a concentration of the particles in the resin layer is not less than 0.15 vol % and less than 7.5 vol %.

17 Claims, 9 Drawing Sheets

(51) Int. Cl.
*G01T 1/164* (2006.01)
*G01T 1/202* (2006.01)
*G01T 1/208* (2006.01)

(52) U.S. Cl.
CPC .......... *G01T 1/202* (2013.01); *G01T 1/20185* (2020.05); *H01L 27/14625* (2013.01); *H01L 27/14685* (2013.01); *G01T 1/208* (2013.01)

(58) Field of Classification Search
CPC ... G01T 1/202; G01T 1/208; H01L 27/14625; H01L 27/14685
See application file for complete search history.

(56) References Cited

U.S. PATENT DOCUMENTS

| | | | |
|---|---|---|---|
| 7,595,493 | B2 | 9/2009 | Okada et al. |
| 8,653,465 | B2 | 2/2014 | Nagano et al. |
| 8,779,369 | B2 | 7/2014 | Ichimura et al. |
| 9,568,614 | B2 | 2/2017 | Ishida et al. |
| 2011/0147602 | A1* | 6/2011 | Ishida .................... G01T 1/202 438/57 |
| 2012/0104266 | A1* | 5/2012 | Yokosawa ............... G01T 1/202 423/499.1 |
| 2014/0239195 | A1* | 8/2014 | Arimoto ............... G01T 1/2002 428/313.9 |
| 2017/0276805 | A1* | 9/2017 | Saruta .................... G01T 1/2023 |
| 2019/0004186 | A1* | 1/2019 | Kotake ................. G01T 1/2018 |

FOREIGN PATENT DOCUMENTS

| | | | | |
|---|---|---|---|---|
| WO | 2014/050861 | A1 | 4/2014 | |
| WO | WO-2014171343 | A1 * | 10/2014 | ........... C09K 11/628 |
| WO | WO-2017195524 | A1 * | 11/2017 | ............... G01T 1/20 |
| WO | WO-2020100809 | A1 * | 5/2020 | ............... A61B 6/00 |

OTHER PUBLICATIONS

Thomas P. Flanagan, "Re-evaluating Hot Melt Adhesives," 9(3) Adhesives Age 28-31 (Mar. 1966).

Extended European Search Report in European Application No. 21182834.8 (dated Dec. 2021).

* cited by examiner

FIG. 1A
FIG. 1B
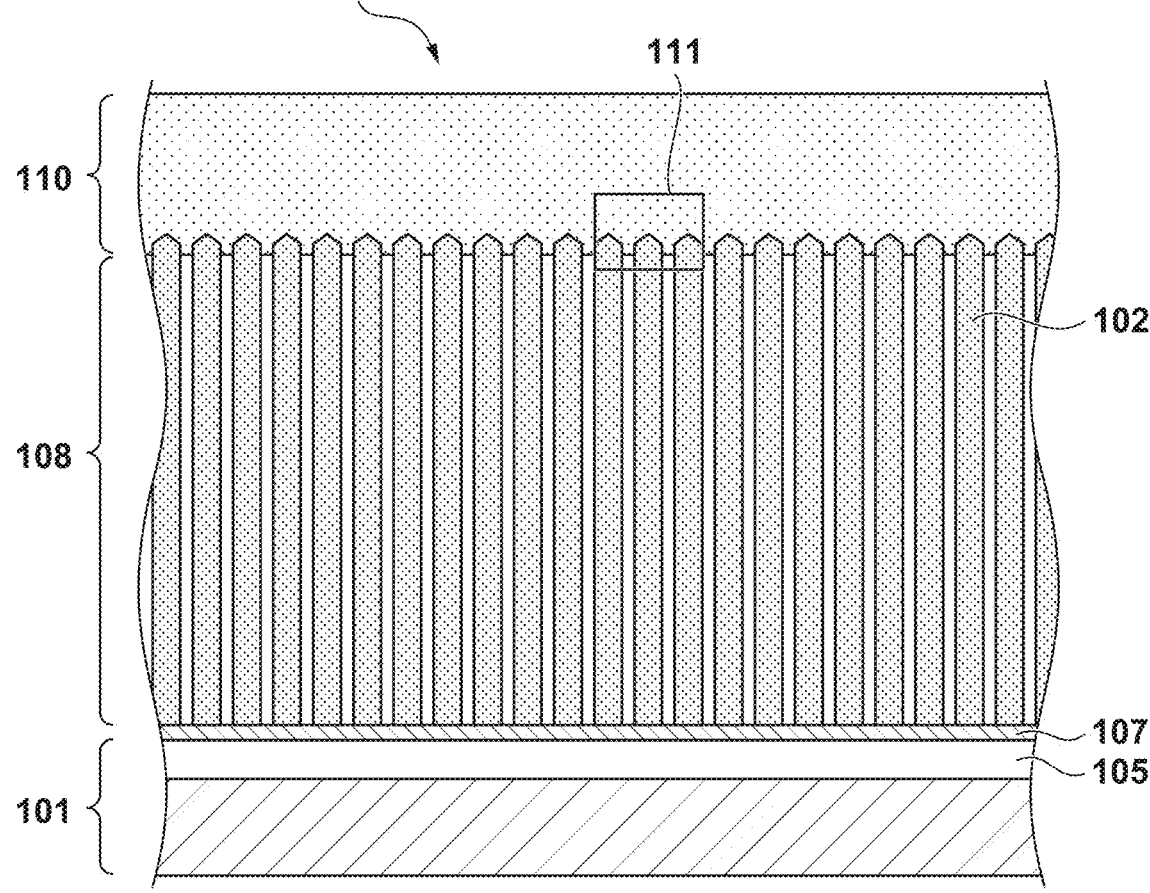
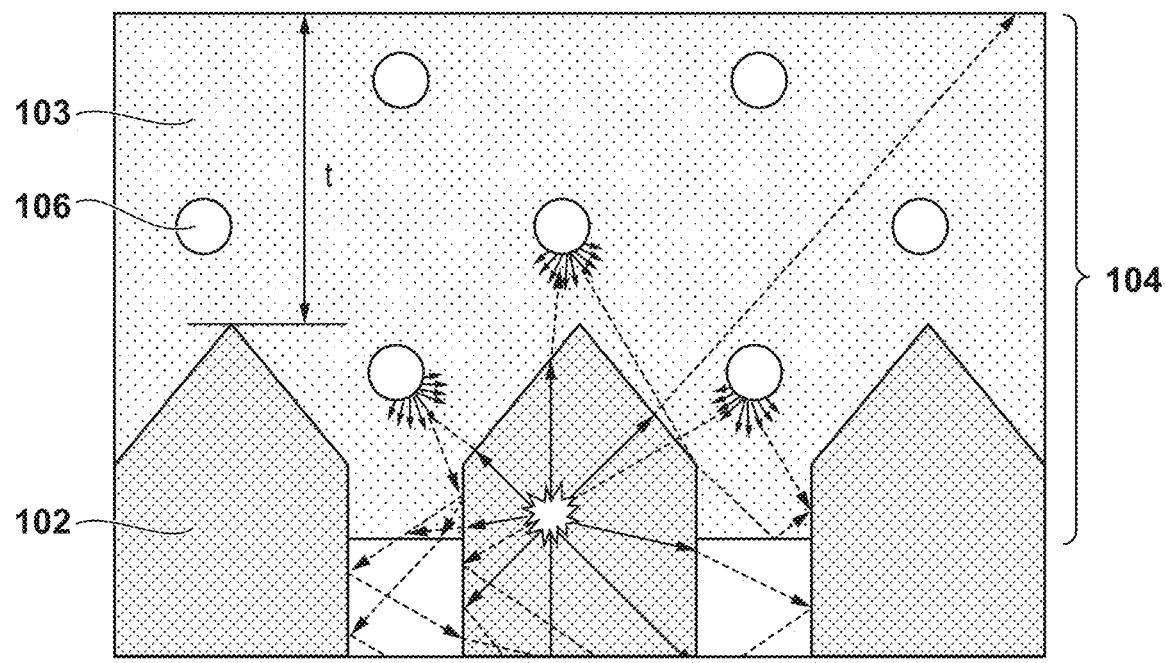

FIG. 3

| THICKNESS t (μm) | VOLUME RATIO OF METAL COMPOUND PARTICLES (vol%) | MTF (2lp/mm) | DQE (0lp/mm) |
|---|---|---|---|
| 21μm-24μm | 1.1 | 0.533 | 0.661 |
| | 1.2 | 0.537 | 0.663 |
| | 1.3 | 0.540 | 0.659 |
| | 1.9 | 0.545 | 0.662 |
| | 4.5 | 0.539 | 0.661 |
| | 7.8 | 0.529 | 0.661 |
| | 11.2 | 0.524 | 0.660 |
| | 19.6 | 0.520 | 0.662 |
| 26μm-29μm | 0.0 | 0.450 | 0.661 |
| | 0.2 | 0.531 | 0.662 |
| | 0.2 | 0.535 | 0.659 |
| | 0.3 | 0.539 | 0.658 |
| | 1.0 | 0.544 | 0.662 |
| | 3.5 | 0.537 | 0.661 |
| | 6.8 | 0.529 | 0.660 |
| | 10.3 | 0.525 | 0.661 |
| | 18.7 | 0.517 | 0.662 |
| 31μm-34μm | 1.6 | 0.498 | 0.661 |
| | 2.3 | 0.513 | 0.661 |
| | 4.4 | 0.528 | 0.662 |
| | 8.1 | 0.529 | 0.663 |
| | 11.6 | 0.524 | 0.661 |
| | 20.0 | 0.515 | 0.659 |
| 41μm-44μm | 3.6 | 0.497 | 0.661 |
| | 5.8 | 0.512 | 0.661 |
| | 12.9 | 0.516 | 0.661 |
| | 21.3 | 0.508 | 0.661 |
| 81μm-84μm | 3.6 | 0.495 | 0.660 |
| | 5.8 | 0.506 | 0.659 |
| | 12.9 | 0.510 | 0.660 |
| | 21.3 | 0.501 | 0.661 |

FIG. 6

| THICKNESS t (μm) | VOLUME RATIO OF METAL COMPOUND PARTICLES (vol%) | MTF (2lp/mm) | DQE (0lp/mm) |
|---|---|---|---|
| 10μm-13μm | 0.0 | 0.455 | 0.661 |
| | 0.2 | 0.531 | 0.661 |
| | 0.2 | 0.535 | 0.663 |
| | 0.3 | 0.541 | 0.659 |
| | 1.0 | 0.548 | 0.662 |
| | 3.5 | 0.542 | 0.661 |
| | 6.8 | 0.528 | 0.661 |
| | 10.3 | 0.522 | 0.660 |
| | 18.7 | 0.512 | 0.662 |
| 26μm-29μm | 0.0 | 0.449 | 0.661 |
| | 0.2 | 0.530 | 0.662 |
| | 0.2 | 0.534 | 0.659 |
| | 0.3 | 0.536 | 0.658 |
| | 1.0 | 0.540 | 0.662 |
| | 3.5 | 0.533 | 0.661 |
| | 6.8 | 0.528 | 0.660 |
| | 10.3 | 0.520 | 0.661 |
| | 18.7 | 0.510 | 0.662 |
| 32μm-35μm | 1.6 | 0.485 | 0.661 |
| | 2.3 | 0.510 | 0.661 |
| | 4.4 | 0.526 | 0.662 |
| | 8.1 | 0.526 | 0.663 |
| | 11.6 | 0.524 | 0.661 |
| | 20.0 | 0.519 | 0.659 |

RADIATION IMAGING PANEL, RADIATION IMAGING APPARATUS, RADIATION IMAGING SYSTEM, AND SCINTILLATOR PLATE

BACKGROUND OF THE INVENTION

Field of the Invention

The present invention relates to a radiation imaging panel, a radiation imaging apparatus, a radiation imaging system, and a scintillator plate.

Description of the Related Art

As a flat panel detector (FPD) for use in radiography in, for example, a medical image diagnosis or nondestructive inspection, there is an indirect conversion type FPD that converts a radiation having passed through an object into light by using a scintillator and detects the light emitted by the scintillator by using a photoelectric conversion element. In this scintillator for converting a radiation into light, a columnar crystal of an alkali metal halide such as cesium iodide is widely used in order to efficiently transmit the light converted from the radiation to the photoelectric conversion element. Since the alkali metal halide deteriorates due to moisture absorption, a protective layer having a moisture preventing function can be arranged over the scintillator. Also, a reflection layer having a light reflecting function can be arranged over the side of the scintillator, which is opposite to the photoelectric conversion element, so that the photoelectric conversion element can efficiently detect the light converted from the radiation by the scintillator. Japanese Patent Laid-Open No. 2006-052980 discloses a radiation detecting apparatus including a phosphor protecting layer having a moisture preventing function and a light reflecting function with respect to a phosphor layer and made of a resin containing fine light reflecting particles.

SUMMARY OF THE INVENTION

The dispersion concentration of the fine light reflecting particles disclosed in Japanese Patent Laid-Open No. 2006-052980 needs more consideration. More specifically, if the concentration of the fine light reflecting particles is too low, the effect of reflecting light becomes insufficient, and this may make the effect of improving an MTF (Modulation Transfer Function) insufficient. On the other hand, Japanese Patent Laid-Open No. 2006-052980 discloses the use of a metal oxide, such as $TiO_2$, which transmits light having entered at a critical angle or less, as the fine light reflecting particles. If the concentration of the fine light reflecting particles is too high, however, the probability that light enters the fine light reflecting particles at a narrow angle equal to or smaller than the critical angle increases. Furthermore, if the concentration of the fine light reflecting particles is high and the particles are in contact with each other, light transmitted through one fine light reflecting particle enters another, so the light may diffuse. As a consequence, the light reflecting effect becomes insufficient, and this may make the MTF improving effect insufficient.

Also, the thickness of the phosphor protecting layer in which the fine light reflecting particles are dispersed needs more consideration. If the phosphor protecting layer is too thick, light diffuses in the phosphor protecting layer, and the MTF improving effect may become insufficient. On the other hand, if the protecting layer is too thin, the moisture preventing function may become insufficient.

An embodiment of the present invention provides a technique advantageous in improving the MTF in a radiation imaging panel.

According to some embodiments, a radiation imaging panel comprising: a substrate on which a plurality of pixels each including a photoelectric conversion element are arranged; a scintillator arranged over the substrate; and a protective layer arranged so as to cover the scintillator, wherein the scintillator includes a plurality of columnar crystals containing an alkali metal halide, the protective layer includes a resin layer containing a resin to which particles of a metal oxide are added, a thickness of the resin layer from an apex of each of the plurality of columnar crystals to an upper surface of the resin layer is not less than 10 μm and less than 30 μm, and a concentration of the particles in the resin layer is not less than 0.15 vol % and less than 7.5 vol %, is provided.

According to some other embodiments, a scintillator plate comprising: a substrate; a scintillator arranged over the substrate; and a protective layer arranged so as to cover the scintillator, wherein the scintillator includes a plurality of columnar crystals containing an alkali metal halide, the protective layer includes a resin layer containing a resin to which particles of a metal oxide are added, a thickness of the resin layer from an apex of each of the plurality of columnar crystals to an upper surface of the resin layer is not less than 10 μm and less than 30 μm, and a concentration of the particles in the resin layer is not less than 0.15 vol % and less than 7.5 vol %, is provided.

Further features of the present invention will become apparent from the following description of exemplary embodiments (with reference to the attached drawings).

BRIEF DESCRIPTION OF THE DRAWINGS

FIGS. 1A and 1B are sectional views showing a configuration example of a radiation imaging panel according to an embodiment;

FIG. 3 is a view showing the characteristics of the radiation imaging panel shown in FIGS. 1A and 1B;

FIG. 6 is a view showing the characteristics of the radiation imaging panel shown in FIGS. 1A and 1B;

DESCRIPTION OF THE EMBODIMENTS

Figure 2:
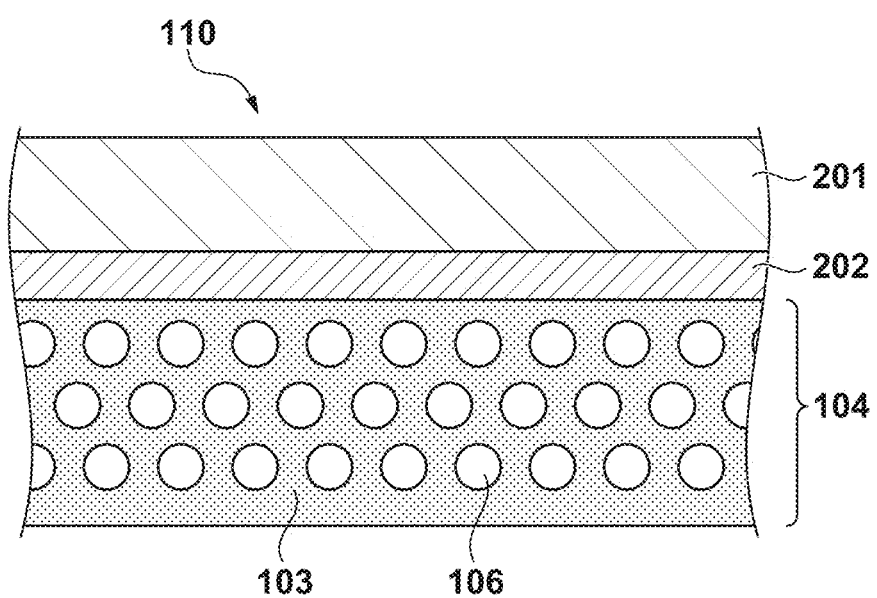
FIG. 2 is a sectional view showing a configuration example of a protective layer of the radiation imaging panel shown in FIGS. 1A and 1B.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A radiation in the present invention includes an α ray, β ray, and a γ ray as beams formed by particles (including photons) emitted by radioactive decay. This radiation can also include beams having energies equal to or higher than those of the abovementioned beams, for example, an X-ray, a particle beam, and a cosmic ray.

The arrangement of a radiation imaging panel according to an embodiment will be explained below with reference to FIGS. 1A to 9B. FIG. 1A is a view showing the sectional structure of a radiation imaging panel 100 according to this embodiment. FIG. 1B is an enlarged view of a portion 111 shown in FIG. 1A.

The radiation imaging panel 100 includes a substrate 101 having a pixel region 105 in which a plurality of pixels each including a photoelectric conversion element are arranged, a scintillator 108 arranged over the substrate 101, and a protective layer 110 arranged so as to cover the scintillator 108. The scintillator 108 includes a plurality of columnar crystals 102 containing an alkali metal halide. The protective layer 110 includes a resin layer 104 containing a resin 103 to which particles 106 of a metal oxide are added. A pixel protecting layer 107 for protecting the pixels arranged in the pixel region 105 may also be formed between the substrate 101 and the scintillator 108.

In the pixel region 105, a plurality of pixels can be arranged in the form of a two-dimensional array. For example, 3,300×2,800 pixels can be arranged on a 550-mm× 445-mm substrate 101. Of the 3,300×2,800 pixels, it is possible to use 10 pixels arranged on the outer circumference as a dummy pixel region, and form an effective pixel region of the pixel region 105 by using 3,280×2,780 pixels arranged inside the dummy pixels. It is possible to appropriately set the number of pixels to be arranged in the pixel region 105, and the number of pixels to be arranged in the effective pixel region of the pixel region 105, in accordance with, for example, the size of the substrate 101 and an object to be imaged.

In the pixel region 105, it is possible to form column signal lines for extracting signals generated in the individual pixels, and row signal lines for driving the individual elements including these pixels arranged in the pixel region 105. The column signal lines and the row signal lines can electrically be connected to a reading circuit substrate and a driving circuit substrate via a flexible circuit board. The substrate 101 can have a connecting terminal portion (not shown) in order to connect the column signal lines and the row signal lines to the reading circuit substrate and the driving circuit substrate. Signals generated in the individual pixels of the pixel region 105 can be output from the radiation imaging panel 100 via the connecting terminal portion.

In this example, the reading circuit and the driving circuit are arranged outside the radiation imaging panel 100. However, the reading circuit and the driving circuit may also be arranged in the radiation imaging panel 100. Even in this case, the connecting terminal portion (not shown) can be arranged over the substrate 101, and signals generated in the individual pixels of the pixel region 105 can be output from the radiation imaging panel 100 via the connecting terminal portion (not shown).

As shown in FIG. 1A, the resin layer 104 in which the metal oxide particles 106 are dispersed in the resin 103 is arranged over the side of the scintillator 108, which is opposite to the pixel region 105. This makes it possible to efficiently use light generated by the scintillator 108, and improve the sensitivity of the radiation imaging panel 100.

The scintillator 108 formed by the plurality of columnar crystals 102 containing an alkali metal halide deteriorates due to moisture absorption. Therefore, the resin layer 104 in which the metal oxide particles 106 are dispersed in the resin 103 can also function as a moisture preventing layer of the scintillator 108. When the resin layer 104 covering the scintillator 108 also functions as a moisture preventing layer, it is possible to suppress deterioration of the scintillator 108 caused by moisture absorption.

FIG. 1B is a view for explaining the function of the resin layer 104 in which the metal oxide particles 106 are dispersed in the resin 103. As shown in FIG. 1B, light emitted toward the resin 103 from the columnar crystal of the scintillator 108 is reflected by specular reflection or diffuse reflection by the dispersed particle 106. A part of the light reflected by the particle 106 returns to the columnar crystal 102 having emitted the light. Another part of the light reflected by the particle 106 attenuates by being repetitively reflected by other particles. That is, it is possible to prevent the light from diffusing in the resin layer 104 and spreading. This shows that a high MTF (Modulation Transfer Function) can be obtained by the resin layer 104 in which the metal oxide particles 106 are dispersed in the resin 103.

Figure 9A:
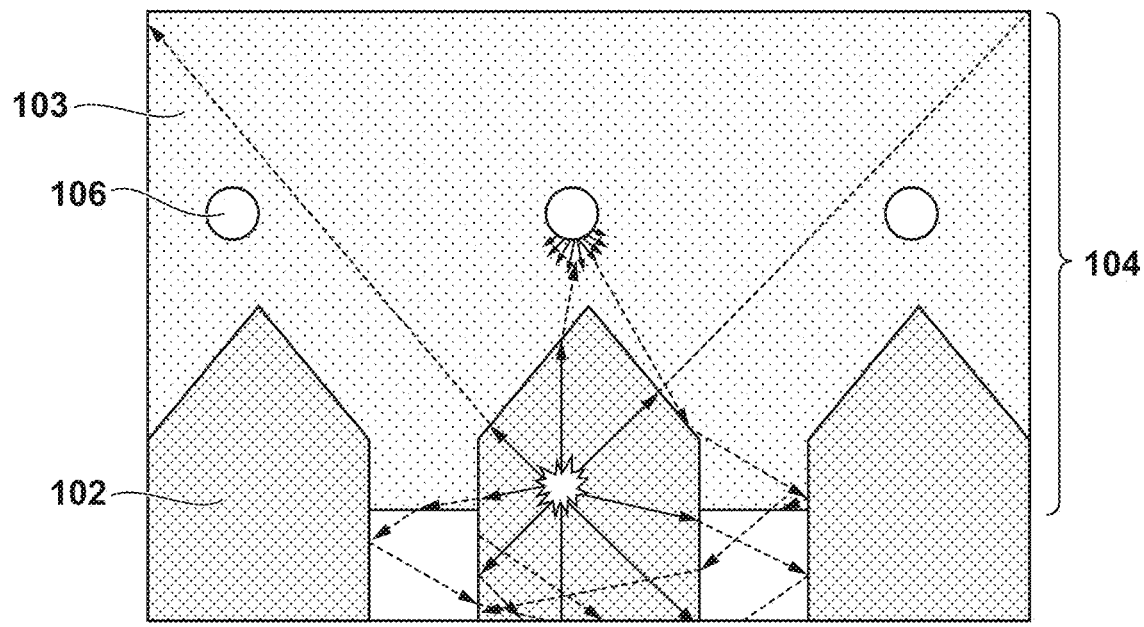
FIGS. 9A and 9B are views for explaining the problem of a resin layer of the radiation imaging panel shown in FIGS. 1A and 1B.
Figure 9B:
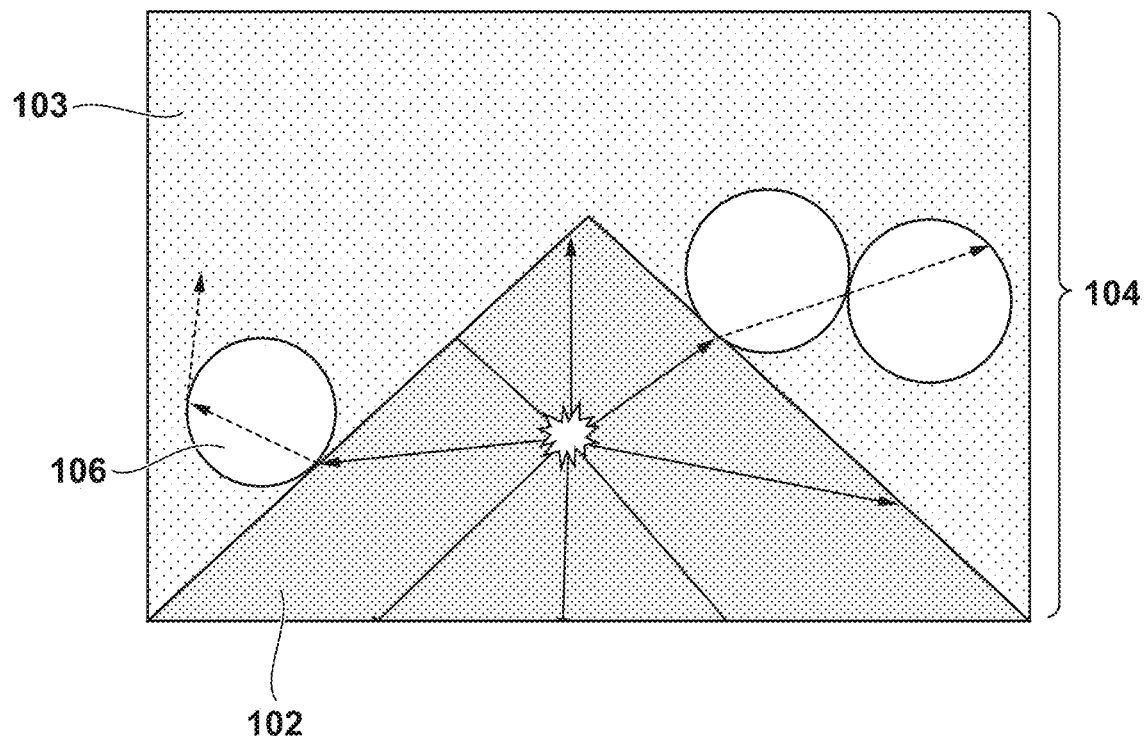

As shown in FIG. 9A, however, the effect of reflection by the metal oxide particles 106 may not be obtained if the amount of the particles 106 is small. On the other hand, as shown in FIG. 9B, if the concentration of the particles 106 of a metal oxide, such as $TiO_2$, which transmits light having entered at a critical angle or less is too high, the probability that light enters at a narrow angle equal to or smaller than the critical angle increases. Furthermore, if the concentration of the fine light reflecting particles is high and the particles are in contact with each other, light transmitted through one fine light reflecting particle enters another and diffuses. As a consequence, the light reflecting effect becomes insufficient, and this may make the MTF improving effect insufficient. An appropriate concentration of the metal oxide particles 106 and an appropriate thickness of the resin layer 104 will be described later.

Next, a method of manufacturing the radiation imaging panel 100 will be explained. As the substrate 101, it is also possible to use, for example, 550-mm×445-mm non-alkali glass having a thickness of 500 μm. The pixel region 105 is formed by repetitively performing a deposition step, a photolithography step, an etching step, and the like on the glass substrate 101. In the pixel region 105, a plurality of pixels each including a light converting element for generating electric charge corresponding to the light emission of the scintillator 108, and a switching element for outputting a signal corresponding to the generated electric charge, are arranged. In addition, a connecting terminal portion (not shown) for driving the pixels and transmitting obtained signals to an external circuit is formed in the pixel region 105.

After the pixel region 105 is formed, an array inspection for checking the operations of the pixels formed in the pixel region 105 can also be performed. After it is confirmed by the array inspection that the operations are good and there is no defective pixel or there are only a few defective pixels, the pixel protecting layer 107 can be formed for the purpose of protecting the connecting terminal portion (not shown), by masking the periphery of the substrate 101 with a masking film. The pixel protecting layer 107 can be formed by, for example, placing the substrate 101 in a spray spin coater, spinning the substrate 101 at a rotational speed of about 100 rpm while spraying a polyimide solution, and drying and annealing the substrate 101 at a temperature of 220° C. after that. The pixel protecting layer 107 can have a thickness of, for example, about 2 µm.

Then, the scintillator 108 is formed. First, a vapor deposition mask is set on a region where no scintillator 108 is to be formed, of the substrate 101 on which the pixel protecting layer 107 is formed, and the substrate 101 is set in a vapor deposition apparatus so that the pixel protecting layer 107 is a vapor deposition surface. After that, codeposition is performed by filling cell vessels with cesium iodide (CsI) and thallium iodide (TlI) such that the Tl concentration is 1 mol % with respect to CsI, and heating the materials. The scintillator 108 can have, for example, a thickness of 380 µm and a film filling rate of 75%. In this state, the outer edges of the scintillator 108 can be arranged outside the outer edges of the pixel region 105. When performing the vapor deposition of the scintillator 108, it is also possible to evacuate the vapor deposition apparatus to $10^{-3}$ Pa, and perform heating by using a lamp heater so that the temperature of the substrate surface is 175° C.

The protective layer 110 can also be formed as follows. FIG. 2 is a view showing a configuration example of the protective layer 110. In the protective layer 110 of this embodiment, an aluminum metal layer 202 is arranged over a base 201, and the resin layer 104 containing the resin 103 to which the metal oxide particles 106 are added is arranged over the metal layer 202. The resin layer 104 of the protective layer 110 can be brought into contact with the scintillator 108. The protective layer 110 is not limited to the three-layered structure shown in FIG. 2. For example, it is also possible to further stack, on the protective layer 110, another layer such as a resin layer to which no metal oxide particles are added. Alternatively, the protective layer 110 can include only the resin layer 104, and can also have a two-layered structure including the resin layer 104 and the metal layer 202.

In this embodiment, a hot melt resin mainly containing a polyolefin resin is used as the resin 103 forming the resin layer 104. The hot melt resin is defined as an adhesive resin that contains neither water nor a solvent, is a solid at room temperature, and is made of a 100%-nonvolatile thermoplastic material (Thomas P. Flanagan, Adhesives Age, vol. 9, No. 3, pp. 28 (1966)). Also, the hot melt resin has the properties that it melts when the resin temperature rises, and solidifies when the resin temperature lowers. The hot melt resin is a resin that is adhesive to another organic material and an inorganic material in a heated molten state, and is not adhesive in a solid state at room temperature. In addition, the hot melt resin contains none of a polar solvating medium, a solvent, and water. Therefore, even when the hot melt resin comes in contact with the scintillator 108 having the alkali halide columnar crystals 102, the hot melt resin does not dissolve the scintillator 108, so the hot melt resin can also have the function of a protective layer.

The hot melt resin is classified in accordance with the type of a base polymer (base material) as a main component, and it is possible to use polyolefin-based, polyester-based, and polyamide-based resins. When using the hot melt resin as the protective layer 110 of the scintillator 108, it is important that the resin has a high moisture proofness and a high light transparency that transmits visible light generated from the scintillator 108.

The resin layer 104 is formed as follows. For example, a polyolefin resin as the resin 103 is dissolved in a toluene-xylene solvent mixture, and the viscosity is adjusted to about 10 cps. In addition, the metal oxide particles 106 is dispersed together with a dispersant in a solution mixture of butanol and propanol in advance. A dispersion prepared by sufficiently cracking, by using a ball mill, the material obtained by dissolving the polyolefin resin in the toluene-xylene solution mixture is added such that the particles 106 are 0 to 32 vol % in the resin layer 104, and then mixed. After this dispersion is sufficiently stirred, the resin layer 104 can be obtained by volatilizing the solvent while preventing foaming.

A material having a refractive index higher than that of the scintillator 108 can be used as the metal oxide particles 106. For example, when above-described CsI (refractive index (n): 1.78 to 1.84 (depending on the type of activator or the like)) is used as the scintillator 108 of an alkali metal halide, a material having a refractive index higher than that of CsI can be used. The metal oxide particles 106 can contain at least one selected from the group consisting of, for example, white lead ($2PbCo_3.Pb(OH)_2$) (n: 1.94 to 2.09), zinc oxide (n: 2.0), yttrium oxide (n: 1.91), zirconium oxide (n: 2.20), and titanium oxide (n: 2.50 to 2.72). For example, the refractive index of the metal oxide particles 106 can be 1.94 or more and 2.72 or less. This embodiment will be explained by assuming that rutile-type titanium dioxide particles having a refractive index higher than those of other titanium oxides are used as the metal oxide.

Also, the average particle size of the metal oxide particles 106 can be 200 nm or more and 500 nm or less. The sensitivity characteristic of a photoelectric conversion element is generally 500 to 800 nm, but the effect of Rayleigh scattering appears if particles are ½ or less the wavelength of light, and this increases the probability of reflection to the incident direction of light. As the metal oxide particles 106, this embodiment uses rutile-type titanium dioxide particles having an average particle size of 250 nm and a particle size distribution in which 10% diameter $D_{10}=195$ µm, 50% diameter (median diameter) $D_{50}=245$ µm, and 90% diameter $D_{90}=275$ µm.

A PET substrate or the like can be used as the base 201. The protective layer 110 of this embodiment is obtained by forming the resin layer 104 to which the metal oxide particles 106 are added, on a film obtained by forming a 12-µm thick aluminum metal layer 202 on a 30-µm thick PET base 201. The protective layer 110 can be formed by, for example, setting the base 201 on which the metal layer 202 is formed in a roll coater apparatus, and coating the metal layer 202 with the resin 103 to which the particles 106 prepared as described above are added. Consequently, the protective layer 110 includes the base 201 arranged over the side of the resin layer 104, which is opposite to the scintillator 108, and the metal layer 202 formed between the resin layer 104 and the base 201.

When the present inventors actually formed the protective layer 110, it was difficult to obtain the film thickness uniformity of the resin layer 104 if the thickness of the resin layer 104 was less than 10 µm. That is, the resin layer 104 requires a thickness of 10 µm or more.

The radiation imaging panel 100 can be manufactured on the base 201 by adhering, on the scintillator 108, the protective layer 110 including the resin layer 104 which has a desired thickness and in which the metal oxide particles 106 having a desired concentration are dispersed.

For example, the formed protective layer 110 is cut in accordance with the size of the scintillator 108 of the substrate 101, and set in a vacuum thermal transfer apparatus. Also, the substrate 101 on which the scintillator 108 is formed is set in the vacuum thermal transfer apparatus so as to face the protective layer 110. After the base 201 and the substrate 101 are aligned by using alignment marks, the substrate 101 and the protective layer 110 are brought into contact with each other at 30° C., and air bubbles are removed by reducing the pressure to $10^{-1}$ Pa. In addition, the substrate 101 on which the scintillator 108 is formed and the protective layer 110 are adhered by first heating the substrate 101 and the protective layer 110 together to 70° C. to 100° C. under pressure, and then holding them in this state for an appropriate time.

Subsequently, a driving substrate or the like is connected, via an anisotropic conductive film or the like, to the connecting terminal portion (not shown) of the substrate 101 on which the protective layer 110 is adhered. Furthermore, a sheet for increasing the strength is adhered on the side of the substrate 101, which is opposite to the scintillator 108. In this manner, the radiation imaging panel 100 of this embodiment is obtained.

Figure 4:
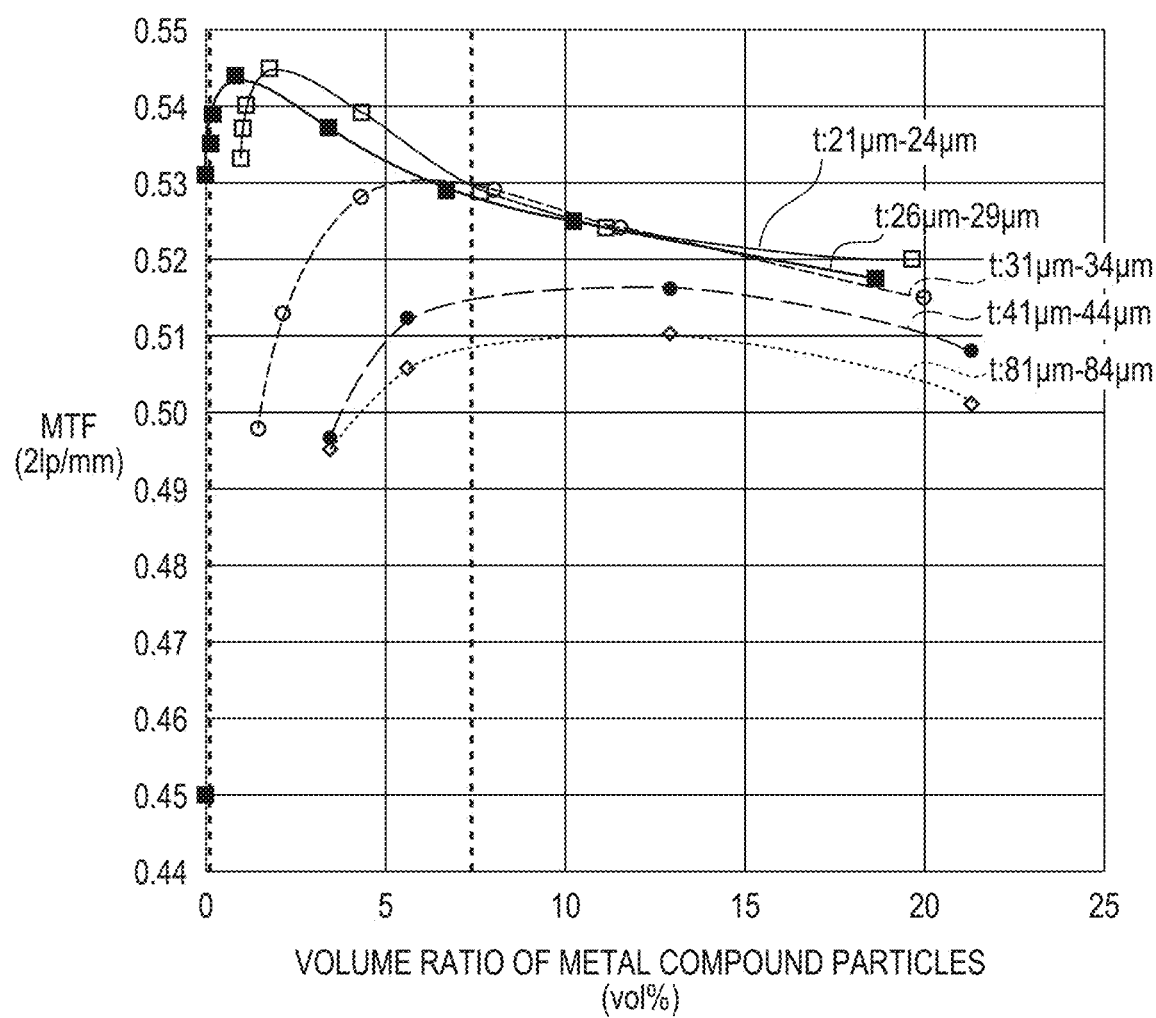
FIG. 4 is a graph showing the characteristics of the radiation imaging panel shown in FIGS. 1A and 1B.

The relationship between the concentration of the metal oxide particles 106, the thickness of the resin layer 104, and the MTF in the radiation imaging panel 100 will be explained below. FIGS. 3 and 4 are views showing the characteristics of the radiation imaging panels 100 manufactured by changing the concentration of the metal oxide particles 106 and the thickness of the resin layer 104. The characteristics of the radiation imaging panel 100 were evaluated by setting the radiation imaging panel 100 in a driving system, and irradiating the radiation imaging panel 100 with an X-ray complying with radiation quality RQA5 of the international standards, thereby measuring the MTF and a DQE (Detective Quantum Efficiency). The MTF values and the DQE values at 2 lp/mm of the volume ratio of the metal oxide particles 106 of the resin layer 104 and a thickness t of the resin layer 104 are shown in the form of a list in FIG. 3, and as a graph plotting these values in FIG. 4. The thickness t of the resin layer 104 is indicated as a range obtained by observing a plurality of SEM images because the height of a phosphor changes in accordance with a column in practice.

Figure 5:
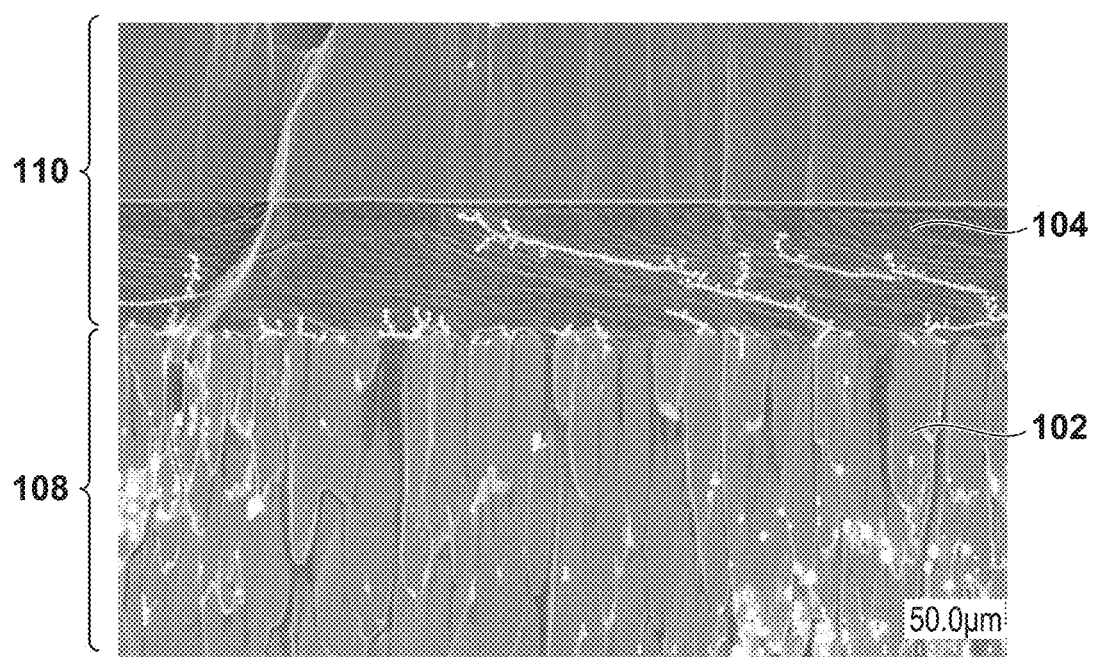
FIG. 5 is a view showing an SEM image of the section of the radiation imaging panel shown in FIGS. 1A and 1B.

As shown in FIG. 1B, the thickness t of the resin layer 104 is the thickness from the apex of each of the plurality of columnar crystals 102 in the resin layer 104 to the upper surface of the resin layer 104. The apex of each columnar crystal 102 can be a portion of the columnar crystal 102, which is farthest from the substrate 101. After the radiation imaging panel 100 is manufactured, the thickness t of the resin layer 104 can be measured by cutting out a small piece, exposing the cut section by a chemical polishing apparatus, and capturing an SEM image of the section. FIG. 5 shows an SEM image of the columnar crystals 102 of the scintillator 108 and the resin layer 104 of the protective layer 110. The thickness t of the resin layer 104 can be controlled by the thickness of the resin 103 when forming the protective layer 110, and the heating temperature and the maintaining time in the vacuum thermal transfer apparatus.

FIGS. 3 and 4 show that when the thickness t of the resin layer 104 is less than 30 µm, the tendency of the improvement of the MTF changes with respect to the volume ratio of the metal oxide particles 106. In addition, when the thickness of the resin layer 104 is less than 30 µm, the MTF increases if the concentration of the metal oxide particles 106 in the resin 104 is 0.15 vol % or more and less than 7.5 vol %. FIG. 3 also reveals that within the range of the thickness of the formed resin layer 104 and the range of the concentration of the metal oxide particles 106, the DQE value is almost unaffected by the thickness of the resin layer 104 and the concentration of the metal oxide particles 106.

From the foregoing, the thickness t of the resin layer 104 from the apex of each of the plurality of columnar crystals 102 in the resin layer 104 to the upper surface of the resin layer 104 is 10 µm or more and less than 30 µm, and the concentration of the metal oxide particles 106 in the resin layer 104 is 0.15 vol % or more and less than 7.5 vol %. This makes it possible to improve the MTF characteristic of the radiation imaging panel 100 while holding the DQE characteristic.

In the above-described embodiment, a case in which the hot melt resin is used as the resin 103 to be used in the resin layer 104 has been explained. However, the resin 103 is not limited to the hot melt resin. As the resin 103 to be used in the resin layer 104, it is also possible to use, for example, a resin having pressure-sensitive adhesiveness obtained by an intermolecular force, that is, a resin that is a so-called adhesive. In this case, a material having a refractive index lower than that of the scintillator 108 can be used as the resin 103. For example, the resin 103 can contain at least one selected from the group consisting of a urethane resin (n: 1.49) and an acrylic resin (n: 1.49 to 1.53). That is, the refractive index of the resin 103 can be, for example, 1.49 or more and 1.53 or less. For example, a polymethyl methacrylate resin (n: 1.491) as an acrylic resin can be used as the resin 103.

Figure 7:
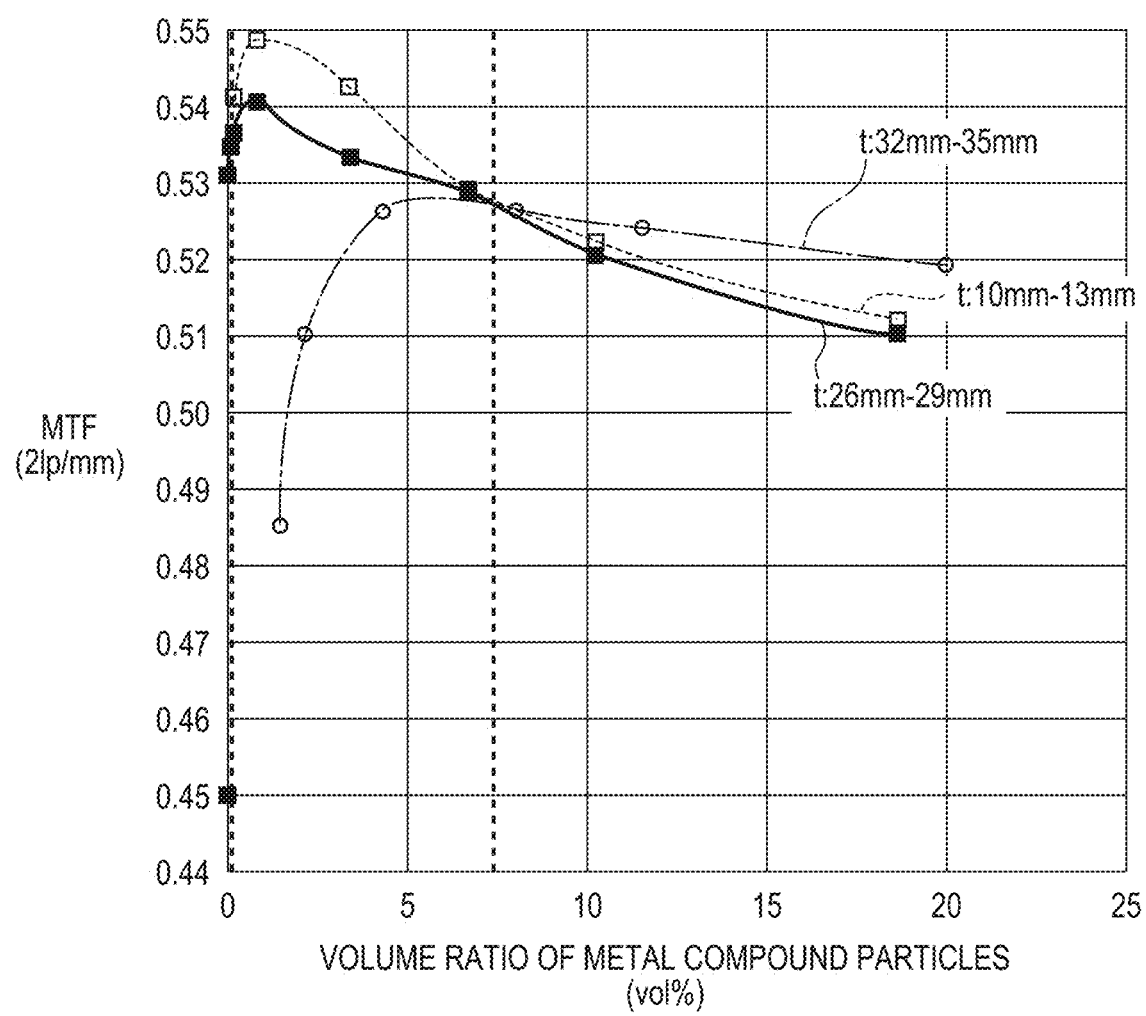
FIG. 7 is a graph showing the characteristics of the radiation imaging panel shown in FIGS. 1A and 1B.

Like FIGS. 3 and 4 described above, FIGS. 6 and 7 are views showing the characteristics of the radiation imaging panels 100 manufactured by changing the concentration of the metal oxide particles 106 and the thickness of the resin layer 104. The radiation imaging panels 100 having the characteristics shown in FIGS. 6 and 7 are the same as the above-described radiation imaging panels 100 except that an acrylic resin was used as the resin 103 instead of the hot melt resin. When using an acrylic resin as the resin 103, the protective layer 110 can be formed by, for example, transferring the resin layer 104 onto the base 201 on which the metal layer 202 is formed, by using a roll laminator. Also, the radiation imaging panel 100 can be manufactured by adhering the protective layer 110 on the scintillator 108 on the substrate 101 by using the roll laminator, and performing pressurized defoaming.

As shown in FIGS. 6 and 7, even when an acrylic resin is used as the resin 103, the tendency of the improvement of the MTF changes with respect to the volume ratio of the metal oxide particles 106 if the thickness t of the resin layer 104 is less than 30 µm. Furthermore, when the thickness of the resin layer 104 is less than 30 µm, the MTF increases if the concentration of the metal oxide particles 106 in the resin layer 104 is 0.15 vol % or more and less than 7.5 vol %. FIG. 6 also reveals that within the range of the thickness of the formed resin layer 104 and the range of the concentration of the metal oxide particles 106, the DQE value is almost unaffected by the thickness of the resin layer 104 and the concentration of the metal oxide particles 106.

From the foregoing, the thickness t of the resin layer 104 from the apex of each of the plurality of columnar crystals 102 in the resin layer 104 to the upper surface of the resin layer 104 is 10 µm or more and less than 30 µm, and the concentration of the metal oxide particles 106 in the resin layer 104 is 0.15 vol % or more and less than 7.5 vol %. This makes it possible to improve the MTF characteristic of the radiation imaging panel 100 while holding the DQE characteristic.

In this embodiment, particles of rutile-type titanium dioxide are used as the metal oxide particles 106. However, even when using the above-described metal oxides (for example, white lead, zinc oxide, yttrium oxide, and zirconium oxide), it is possible to improve the MTF characteristic of the radiation imaging panel 100 while holding the DQE characteristic, by controlling the concentration of the metal oxide particles 106 and the thickness of the resin layer 104 as described above.

Also, a case using the substrate 101 including the pixel region 105 where a plurality of pixels are arranged has been explained in this embodiment, but the present invention is not limited to this. For example, the substrate 101 need not include the pixel region 105. In this case, the member denoted by reference numeral 100 can be called a scintillator plate. For example, when this scintillator plate is mounted on a sensor substrate including a pixel region where a plurality of pixels are arranged, the resultant structure can function as a radiation imaging panel. When the substrate 101 does not include the pixel region 105, therefore, the substrate 101 can be a transparent substrate that transmits light emitted by the scintillator 108.

Figure 8:
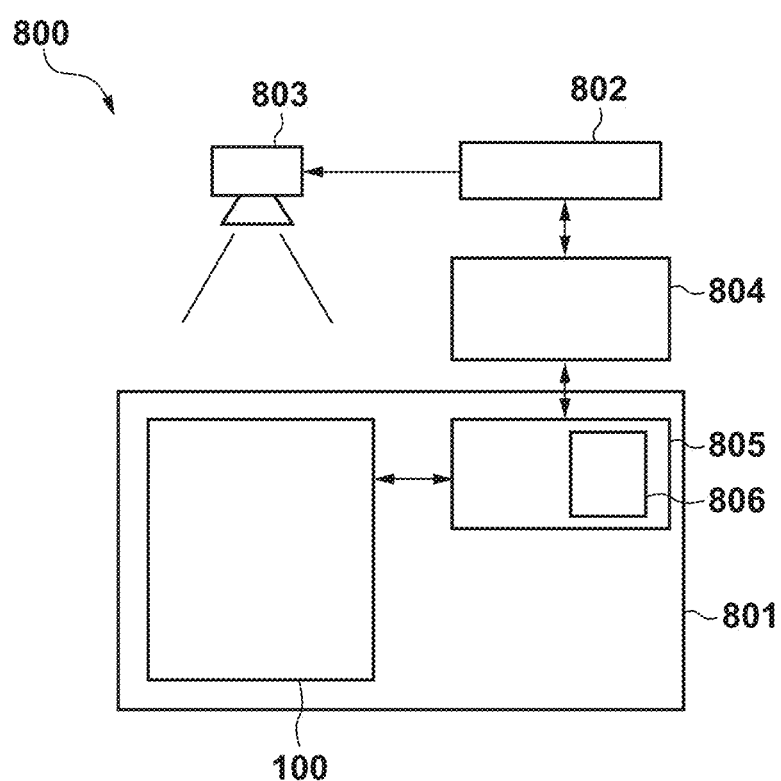
FIG. 8 is a view showing configuration examples of a radiation imaging apparatus using the radiation imaging panel shown in FIGS. 1A and 1B and a radiation imaging system.

A radiation imaging apparatus incorporating the radiation imaging panel 100 described above and a radiation imaging system 800 using this radiation imaging apparatus incorporating the radiation imaging panel 100 will be explained below with reference to FIG. 8.

The radiation imaging system 800 is so configured as to electrically capture an optical image formed by a radiation, thereby obtaining an electrical radiation image (that is, radiation image data). The radiation imaging system 800 includes, for example, a radiation imaging apparatus 801, an exposure controller 802, a radiation source 803, and a computer 804.

The radiation source 803 for emitting a radiation to the radiation imaging apparatus 801 starts emitting radiation in accordance with an exposure command from the exposure controller 802. This radiation emitted from the radiation source 803 irradiates the radiation imaging apparatus 801 through an object to be inspected (not shown). The radiation source 803 stops emitting the radiation in accordance with a stop command from the exposure controller 802.

The radiation imaging apparatus 801 includes the above-described radiation imaging panel 100, a controller 805 for controlling the radiation imaging panel 100, and a signal processor 806 for processing signals output from the radiation imaging panel 100. As an example, the signal processor 806 can perform A/D conversion on a signal output from the radiation imaging panel 100, and output the signal as radiation image data to the computer 804. As another example, the signal processor 806 can also generate a stop signal for stopping the emission of a radiation from the radiation source 803, based on a signal output from the radiation imaging panel 100. This stop signal is supplied to the exposure controller 802 via the computer 804, and the exposure controller 802 transmits a stop command to the radiation source 803 in response to the stop signal.

The controller 805 can be a PLD (the abbreviation of a Programmable Logic Device) such as an FPGA (the abbreviation of a Field Programmable Gate Array), an ASIC (the abbreviation of an Application Specific Integrated Circuit), a general-purpose computer in which a program is installed, or a combination of all or some of these components.

In this embodiment, the signal processor 806 is arranged in the controller 805 or shown as one function of the controller 805. However, the present invention is not limited to this. The controller 805 and the signal processor 806 can also be separate units. Furthermore, the signal processor 806 can also be arranged outside the radiation imaging apparatus 801. For example, the computer 804 can have the function of the signal processor 806. Accordingly, the signal processor 806 can also be included in the radiation imaging system 800, as a signal processing device for processing signals output from the radiation imaging apparatus 801.

The computer 804 can control the radiation imaging apparatus 801 and the exposure controller 802, and can perform a process of receiving radiation image data from the radiation imaging apparatus 801 and displaying the data as a radiation image. The computer 804 can also function as an input unit by which the user inputs conditions for capturing a radiation image.

As an example, the exposure controller 802 has an exposure switch, and, when the user turns on this exposure switch, transmits an exposure command to the radiation source 803, and transmits a start notification indicating the start of emission of a radiation to the computer 804. The computer 804 having received the start notification notifies the controller 805 of the radiation imaging apparatus 801 of the start of emission of a radiation in response to the start notification. In response to this notification, the controller 805 causes the radiation imaging panel 100 to generate a signal corresponding to the incident radiation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-120869, filed Jul. 14, 2020 which is hereby incorporated by reference herein in its entirety.

What is claimed is:

1. A radiation imaging panel comprising:
   a substrate on which a plurality of pixels each including a photoelectric conversion element are arranged;
   a scintillator arranged over the substrate; and
   a protective layer arranged so as to cover the scintillator,
   wherein the scintillator includes a plurality of columnar crystals containing an alkali metal halide,
   the protective layer includes a resin layer containing a resin to which particles of a metal oxide are added,
   a thickness of the resin layer from an apex of each of the plurality of columnar crystals to an upper surface of the resin layer is 10 µm to less than 30 µm, and
   a concentration of the particles in the resin layer is 0.15 vol % to less than 7.5 vol %.

2. The panel according to claim 1, wherein an average particle size of the particles is 200 nm to 500 nm.

3. The panel according to claim 1, wherein a refractive index of the particles is 1.94 to 2.72.

4. The panel according to claim 1, wherein the particles contain at least one selected from the group consisting of white lead, zinc oxide, and titanium oxide.

5. The panel according to claim 1, wherein the particles contain rutile-type titanium dioxide.

6. The panel according to claim 1, wherein a refractive index of the resin is 1.49 to 1.53.

7. The panel according to claim 1, wherein the resin is made of a nonvolatile thermoplastic material.

8. The panel according to claim 7, wherein the resin contains a hot melt resin.

9. The panel according to claim 1, wherein the resin contains a resin having pressure-sensitive adhesiveness obtained by an intermolecular force.

10. The panel according to claim 9, wherein the resin contains at least one selected from the group consisting of a urethane resin and an acrylic resin.

11. The panel according to claim 1, wherein the alkali metal halide contains cesium iodide.

12. The panel according to claim 1, wherein the protective layer further includes a base formed on a side of the resin layer, which is opposite to the scintillator.

13. The panel according to claim 12, wherein the protective layer further includes a metal layer formed between the resin layer and the base.

14. A radiation imaging apparatus comprising:
the radiation imaging panel according to claim 1; and
a controller configured to control the radiation imaging panel.

15. A radiation imaging system comprising:
the radiation imaging apparatus according to claim 14; and
a signal processing apparatus configured to process a signal output from the radiation imaging apparatus.

16. A scintillator plate comprising:
a substrate;
a scintillator arranged over the substrate; and
a protective layer arranged so as to cover the scintillator,
wherein the scintillator includes a plurality of columnar crystals containing an alkali metal halide,
the protective layer includes a resin layer containing a resin to which particles of a metal oxide are added,
a thickness of the resin layer from an apex of each of the plurality of columnar crystals to an upper surface of the resin layer 10 µm to less than 30 µm, and
a concentration of the particles in the resin layer is 0.15 vol % to less than 7.5 vol %.

17. The plate according to claim 16, wherein the substrate is a transparent substrate that transmits light generated by the scintillator.

* * * * *